PLURAL CHANNEL WIDE BAND AMPLIFIER
Filed April 2, 1958
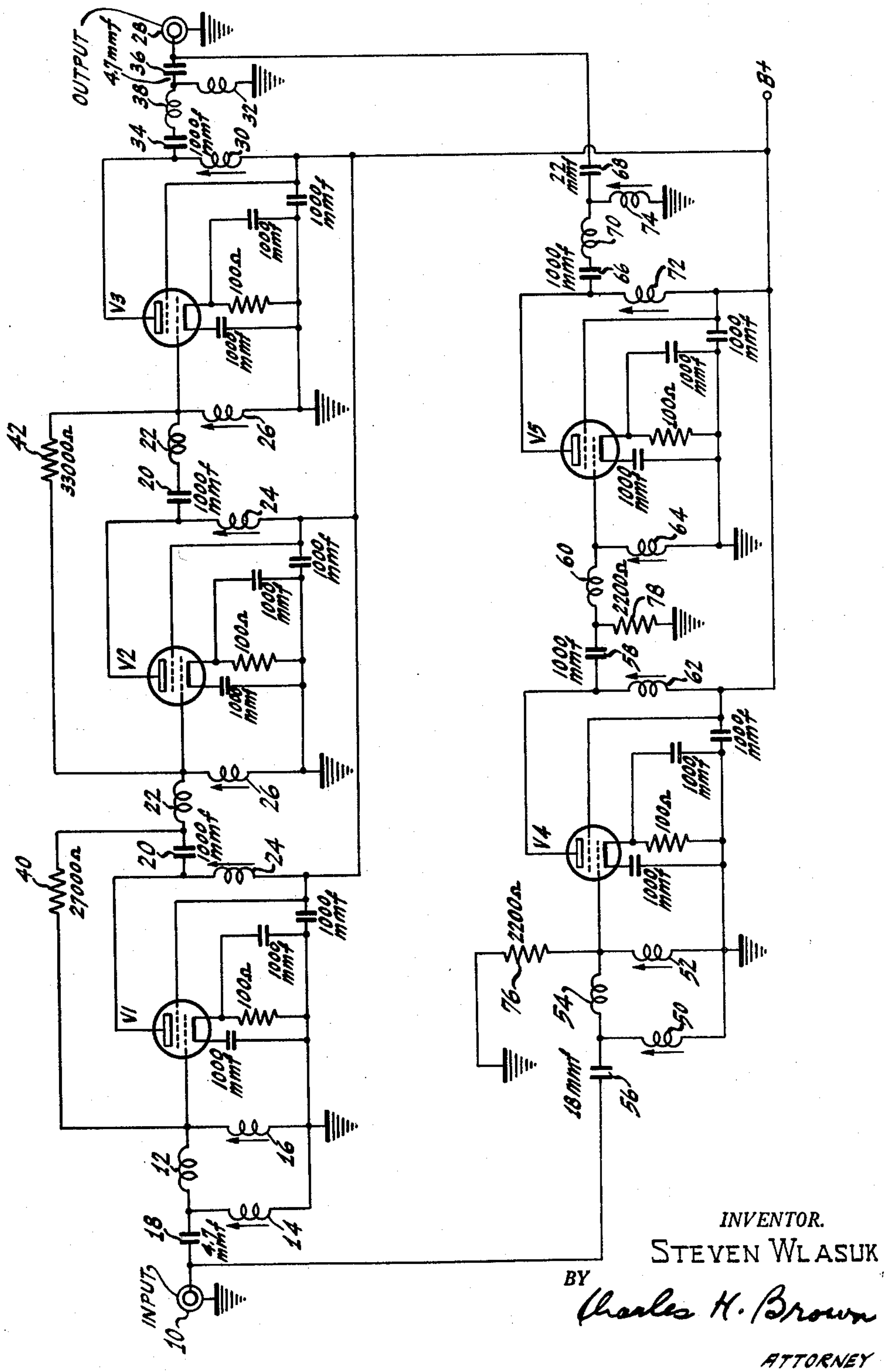
INVENTOR.
STEVEN WLASUK
BY Charles H. Brown
ATTORNEY United States Patent Office 2,935,695
Patented May 3, 1960

2,935,695

PLURAL CHANNEL WIDE BAND AMPLIFIER

Steven Wlasuk, Brooklawn, N.J., assignor to Radio Corporation of America, a corporation of Delaware Application April 2, 1958, Serial No. 725,897
6 Claims. (Cl. 330—84)

The invention relates to an amplifier, and particularly to an amplifier for amplifying VHF (very high frequency) television signals.

An object of the invention is to provide an improved amplifier for amplifying radio frequency signals extending over several television bands.

Another object of the invention is to provide improved amplification of the VHF television channels 2 through 6 and 7 through 13.

Another object of the invention is to provide improved amplification of the VHF television channels for multiple outlet systems which operate from a common source.

The amplifier in accordance with the invention comprises an amplifier circuit for the lower VHF television channels 2 through 6, and an amplifier circuit for the higher VHF television channels 7 through 13. The two amplifier circuits are coupled between a common input and a common output by means of bandpass filters. The input and output bandpass filters for the higher frequency amplifier circuit are tuned to pass only the frequencies of the higher VHF television channels, while the input and output bandpass filters for the lower frequency amplifier circuit are tuned to pass only the frequencies of lower VHF television channels. The higher frequency amplifier circuit is provided with resistor feedback circuits which increase its bandwidth. Similarly, the lower frequency amplifier circuit is provided with shunt resistors which increase its bandwidth.

The invention is explained in connection with the accompanying drawing, in which the single figure shows a schematic diagram of the invention.

The amplifier shown in the figure is intended to be used primarily in multiple outlet systems in which a large number of television receivers are supplied with a television signal from a common source. An example of a multiple outlet system is the use of a single receiving antenna for a number of television receivers in an apartment building. Since the signal derived from such an antenna is usually insufficient for a large number of television receivers, it is usually necessary to amplify the signal. The amplifier in accordance with the invention is intended to provide such amplification. However, the amplifier is not limited to such an example. The television signal to be amplified is applied to input means such as the coaxial terminal 10. This signal usually contains all frequencies of the VHF television channels 2 through 6 and 7 through 13. Since the lower frequency channels 2 through 6 are separated from the higher frequency channels 7 through 13 by a large band of frequencies, it is convenient and practical to provide separate amplifier circuits for the higher and lower frequency channels.

The amplifier circuit for the higher frequency channels comprises three electron discharge devices, V1, V2, V3. The electron discharge devices V1, V2, and V3 are preferably vacuum tube tetrodes such as RCA type 6CY5. The input electrode of the first tetrode V1 is coupled to the terminal 10 through a high frequency input bandpass filter comprising a fixed series inductor 12, two adjustable shunt inductors 14, 16, and a series capacitor 18. The high frequency input bandpass filter is designed and adjusted so that it passes substantially only frequencies of the higher VHF television channels 7 through 13, and so that it rejects the frequencies of the lower VHF television channels 2 through 6 and at the same time presents a high impedance to those frequencies of the lower VHF channels. The anode or collecting electrode of the first tetrode V1 is coupled to the control electrode of the second tetrode V2 through an intermediate coupling circuit comprising a series capacitor 20 and a series inductor 22. The anode of the first tetrode V1 is also connected through an adjustable inductor 24 to the terminal B+ of a source of unidirectional potential, and this terminal is positive with respect to a point of reference potential. The control electrode of the second tetrode V2 is coupled to the point of reference potential through an adjustable inductor 26. The adjustable inductors 24, 26 are designed and adjusted to tune with the capacity present within the tetrodes V1, V2 so that the net reactive values are near or at zero within the passband of television channels 7 through 13. The anode of the second tetrode V2 is coupled to the control electrode of the third tetrode V3 through a similar intermediate coupling circuit. The anode of the third tetrode V3 is coupled to output means for the amplifier, such as the coaxial terminal 28, through a high frequency output bandpass filter comprising two adjustable shunt inductors 30, 32, two fixed series capacitors 34, 36, and a fixed series inductor 38. The high frequency output bandpass filter is designed and adjusted so that it passes substantially only frequencies of the higher VHF television channels 7 through 13, and so that it rejects the frequencies of the lower VHF television channels 2 through 6 and at the same time presents a high impedance to those frequencies of the lower VHF channels. The remainder of the high frequency amplifier circuit, including the cathodes or emitting electrodes and the screen grids of the tetrodes V1, V2, V3, is connected in a conventional manner as shown.

While the high frequency amplifier circuit described thus far provides sufficient amplification of the higher VHF television channels 7 through 13 for many purposes, improved bandwidth for these channels may be obtained in accordance with the invention by the feedback resistors 40, 42. The first feedback resistor 40 is coupled between the control electrode of the first tetrode V1 and the junction of the series capacitor 20 and the series inductor 22 of the intermediate coupling circuit between the first and second tetrodes V1, V2. The second feedback resistor 42 is coupled between the control electrodes of the second and third tetrodes V2, V3. These feedback resistors, 40, 42 provide additional input resistance so that the response of the high frequency amplifier circuit is less frequency sensitive. Thus, improved bandwidth is obtained.

The amplifier circuit for the lower frequency channels comprises two electron discharge devices V4, V5 which are preferably tetrodes, such as RCA type 6CY5. The control electrode of the first tetrode V4 is coupled to the input terminal 10 through a low frequency input bandpass filter comprising two adjustable shunt inductors 50, 52, a fixed series inductor 54, and a series capacitor 56. The low frequency input bandpass filter is designed and adjusted so that it passes substantially only frequencies of the lower VHF television channels 2 through 6, and so that it rejects the frequencies of the higher VHF television channels 7 through 13 and at the same time presents a high impedance to those frequencies of the higher VHF channels. The anode of the first tetrode V4 is coupled to the control electrode of the second tetrode V5 through an intermediate coupling circuit comprising a fixed series capacitor 58, a fixed series inductor 60, and two adjustable shunt inductors 62, 64. The first adjustable shunt inductor 62 is coupled between the anode of the first tetrode V4 and the source of positive unidirectional potential. The second adjustable inductor 64 is coupled between the control electrode of the second tetrode V5 and the point of reference potential. The adjustable inductors 62, 64 are designed and adjusted to tune with the capacity present within the tetrodes V4, V5 so that the net reactive values are near or at zero within the passband of televsion channels 2 through 6. The anode of the second tetrode V5 is coupled to the output coaxial terminal 28 through a low frequency output bandpass filter comprising two fixed series capacitors 66, 68, a fixed series inductor 70, and two adjustable shunt inductors 72, 74. The first shunt inductor 72 is coupled between the anode of the second tetrode V5 and the source of positive unidirectional potential, and the second shunt inductor 74 is coupled from the junction of the series inductor 70 and the series capacitor 68 to the point of reference potential. The low frequency output bandpass filter is designed and adjusted so that it passes substantially on frequencies of the lower VHF television channels 2 through 6, and so that it rejects the frequencies of the higher VHF television channels 7 through 13 and at the same time presents a high impedance to those frequencies of the higher VHF channels. The remainder of the low frequency amplifier circuit, including the cathodes or emitting electrodes and the screen grids of the tetrodes V4, V5, is connected in a conventional manner as shown.

While the low frequency amplifier circuit described thus far provides sufficient amplification of the lower VHF television channels 2 through 6 for many purposes, improved bandwidth for these channels may be obtained in accordance with the invention by the use of shunt resistors 76, 78. The first shunt resistor 76 is coupled between the control electrode of the first tetrode V4 and the point of reference potential. The second shunt resistor 78 is coupled from the junction of the series capacitor 58 and the series inductor 60 of the intermediate coupling circuit to the point of reference potential. These shunt resistors 76, 78 provide a low input resistance for the tetrodes V4, V5, so that the response of the low frequency amplifier circuit is less frequency sensitive. Thus, improved bandwidth is obtained.

While the circuit so far described, contains means of splitting the high and low channel VHF signals within the circuits so that single input and/or output is obtained the input and/or output circuits of either amplifier can be disconnected from terminals 10, 28 and reconnected to a new input or output connection. Separate signals can then be provided from two signal sources and fed to separate systems.

While no means are shown in either of the amplifier circuits for heating the cathodes of the tetrodes, it is to be understood that the cathodes may be heated either directly or indirectly.

Typical values for the various circuit components are shown in the figure. The resistance values are in ohms, and the capacitor values are in micromicrofarads. Approximate values for the inductors are given below:

| | | |
|---|---|---|
| Inductor 12 | μh | .39 |
| Inductor 14 | μh | .15 |
| Inductor 16 | μh | .10 |
| Inductor 22 | μh | .47 |
| Inductor 24 | μh | .12 |
| Inductor 26 | μh | .10 |
| Inductor 30 | μh | .12 |
| Inductor 32 | μh | .15 |
| Inductor 38 | μh | .47 |
| Inductor 50 | μh | .51 |
| Inductor 52 | μh | 1.2 |
| Inductor 54 | μh | .95 |

| | | |
|---|---|---|
| Inductor 60 | μh | 1.0 |
| Inductor 62 | μh | 2.2 |
| Inductor 64 | μh | 1.2 |
| Inductor 70 | μh | .90 |
| Inductor 72 | μh | 4.1 |
| Inductor 74 | μh | .51 |

The amplifier described has been built and satisfactorily operated to pass television signals extending over high and low frequency bands in the range of 55 to 88 mc. and 175 to 216 mc. Amplification for the higher VHF television channels with the circuit values given above is approximately 34 decibels (db), and the amplification for the lower VHF television channels is approximately 27 db. The amplification over these ranges did not vary more than 2 db. The input impedance and the output impedance were each 75 ohms, combined as illustrated.

What is claimed is:

1. An amplifier for amplifying a high frequency band of radio frequency energy and a low frequency band of radio frequency energy, comprising input means for applying said high frequency and said low frequency energy to said amplifier, a first electron discharge device having an emitting electrode, a control electrode, and a collecting electrode, an input filter tuned to pass said high frequency band of radio frequency energy coupled between said input means and said control electrode of said first discharge device, output means for deriving said high frequency and said low frequency energy from said amplifier, an output filter tuned to pass said high frequency band of radio frequency energy, means coupling said output filter between said collecting electrode of said first discharge device and said output means, a feedback resistor coupled between said collecting electrode and said control electrode of said first discharge device, a second electron discharge device having an emitting electrode, a control electrode and a collecting electrode, an input filter tuned to pass said low frequency band of radio frequency energy coupled between said input means and said control electrode of said second discharge device, an output filter tuned to pass said low frequency band of radio frequency energy, means coupling said last-named output filter between said collecting electrode of said second discharge device and said output means, a first shunt resistor coupled between said control electrode of said second discharge device and a point of reference potential, a second shunt resistor coupled between said collecting electrode of said second discharge device and said point of reference potential, and means connecting the emitting electrodes of said electron discharge devices to said point of reference potential.

2. An amplifier for amplifying a high frequency band of radio frequency energy and a low frequency band of radio frequency energy, comprising input means for applying said high frequency and said low frequency energy to said amplifier, a plurality of electron discharge devices each having an emitting electrode, a control electrode, and a collecting electrode, means connecting the emitting electrodes of said devices to a point of reference potential, an input filter tuned to pass said high frequency band of radio frequency energy coupled between said input means and the control of the first discharge device, output means for deriving said high frequency and said low frequency energy from said amplifier, an output filter tuned to pass said high frequency band of radio frequency energy coupled between the collecting electrode of the second discharge device and said output means, intermediate coupling means coupled between the collecting electrode of said first discharge device and the control electrode of said second discharge device, a first feedback resistor coupled between said collecting electrode and said control electrode of said first discharge device, a second feedback resistor coupled around said intermediate coupling means, an input filter tuned to pass said low frequency band of radio frequency energy coupled between said input means and the control electrode of a third discharge device, an output filter tuned to pass said low frequency band of radio frequency energy coupled between the collecting electrode of a fourth discharge device and said output means, intermediate coupling means coupled between the collecting electrode of said third discharge device and the control electrode of said fourth discharge device, a first shunt resistor coupled between said control electrode of said third discharge device and a point of reference potential, and a second shunt resistor coupled at one end through a direct current path to said control electrode of said fourth discharge device and at its other end to said point of reference potential.

3. An amplifier for amplifying a high frequency band of radio frequency energy and a low frequency band of radio frequency energy, comprising input means for applying said high frequency and said low frequency energy to said amplifier, a plurality of electron discharge devices each having an emitting electrode, a control electrode, and a collecting electrode, means connecting the emitting electrodes of said devices to a point of reference potential, an input filter tuned to pass said high frequency band of radio frequency energy coupled between said input means and the control electrode of the first discharge device, output means for deriving said high frequency and said low frequency energy from said amplifier, an output filter tuned to pass said high frequency band of radio frequency energy coupled between the collecting electrode of the second discharge device and said output means, means coupling the collecting electrode of said first discharge device to the control electrode of a third discharge device, means coupling the collecting electrode of said third discharge device to the control electrode of said second discharge device, first feedback resistor coupled between said collecting electrode and said control of said first discharge device, a second feedback resistor coupled between said collecting electrode and said control electrode of said third discharge device, an input filter tuned to pass said low frequency band of radio frequency energy coupled between said input means and the control electrode of a fourth discharge device, an output filter tuned to pass said low frequency band of radio frequency energy coupled between the collecting electrode of a fifth discharge device and said output means, intermediate coupling means coupled between the collecting electrode of said fourth discharge device and the control electrode of said fifth discharge device, a first shunt resistor coupled between said control electrode of said fourth discharge device and a point of reference potential, and a second shunt resistor coupled at one end through a direct current path to said control electrode of said fifth discharge device and at its other end to said point of reference potential.

4. An amplifier for amplifying a high frequency band of radio frequency energy and a low frequency band of radio frequency energy, comprising input means for applying said high frequency and said low frequency energy to said amplifier, a plurality of electron discharge devices each having an emitting electrode, a control electrode, and a collecting electrode, means connecting the emitting electrodes of said devices to a point of reference potential, an input filter tuned to pass said high frequency band of radio frequency energy and to reject said low frequency band of radio frequency energy coupled between said input means and the control electrode of the first discharge device, output means for deriving said high frequency and said low frequency energy from said amplifier, an output filter tuned to pass said high frequency band of radio frequency energy and to reject said low frequency band of radio frequency energy coupled between the collecting electrode of the second discharge device and said output means, means coupling the collecting electrode of said first discharge device to the control electrode of a third discharge device, means coupling the collecting electrode of said third discharge device to the control electrode of said second discharge device, a first feedback resistor coupled between said collecting electrode and said control electrode of said first discharge device, a second feedback resistor coupled between said collecting electrode and said control electrode of said third discharge device, an input filter tuned to pass said low frequency band of radio frequency energy and to reject said high frequency band of radio frequency energy coupled between said input means and the control electrode of a fourth discharge device, an output filter tuned to pass said low frequency band of radio frequency energy and to reject said high frequency band of radio frequency energy coupled between the collecting electrode of a fifth discharge device and said output means, intermediate coupling means coupled between the collecting electrode of said fourth discharge device and the control electrode of said fifth discharge device, a first shunt resistor coupled between said control electrode of said fourth discharge device and a point of reference potential, and a second shunt resistor coupled at one end through an inductance to said control electrode of said fifth discharge device and at its other end to said point of reference potential.

5. In a multiple outlet system in which a plurality of television receivers are designed to receive signals transmitted over relatively high and low television channels and supplied to a common input terminal, an amplifier coupled to said common input terminal for amplifying both a high frequency band of radio frequency energy covering a plurality of television channels and a low frequency band of radio frequency energy covering a plurality of television channels, a common output terminal for said amplifier to which a plurality of television receivers may be coupled, said amplifier including a first path for passing said high frequency band and in parallel therewith a second path for passing said low frequency band, said first path including first, second and third multi-electrode electron discharge devices arranged in cascade, said second path including fourth and fifth multi-electrode electron discharge devices arranged in cascade, said first path having in series therewith at the input and output terminals filters tuned to pass said high frequency band of radio frequency energy and to reject said low frequency band, said second path having in series therewith at the input and output terminals filters tuned to pass said low frequency band of radio frequency energy and to reject said high frequency band, two of said electron discharge devices in said first path having feedback resistors between their respective output and input electrodes for increasing the bandwidth of said first path, a shunt resistor coupled between the input electrode of the fourth electron discharge device and a point of reference potential, and another shunt resistor connected between said point of reference potential and a point on the circuit coupling together said fourth and fifth electron discharge devices, said shunt resistors serving to increase the bandwidth of said second path.

6. A system as defined in claim 5 wherein said filters each include a network of inductors, at least one inductor of each network being adjustable.

References Cited in the file of this patent

UNITED STATES PATENTS

| | | |
|---|---|---|
| 2,727,141 | Cheek | Dec. 13, 1955 |
| 2,771,518 | Sziklai | Nov. 20, 1956 |
| 2,747,029 | Abbett | May 22, 1956 |
| 2,757,244 | Tomcik | July 31, 1956 |
| 2,775,657 | Van Zelst | Dec. 25, 1956 |

FOREIGN PATENTS

| | | |
|---|---|---|
| 459,723 | Great Britain | Jan. 13, 1937 |